United States Patent [19]

Tonooka

[11] Patent Number: 4,883,428
[45] Date of Patent: Nov. 28, 1989

[54] TEST SOCKET INCORPORATING CIRCUIT ELEMENTS

[75] Inventor: Takashi Tonooka, Shizuoka, Japan

[73] Assignee: Texas Instruments Incorporated, Dallas, Tex.

[21] Appl. No.: 159,152

[22] Filed: Feb. 23, 1988

[30] Foreign Application Priority Data

Feb. 27, 1987 [JP] Japan .................................. 62-046301

[51] Int. Cl.⁴ ........................................... H01R 23/72
[52] U.S. Cl. ..................................... 439/69; 361/395; 439/70
[58] Field of Search ...................... 439/68–73, 439/620; 361/393, 395, 401, 402, 403, 396; 174/52 FP

[56] References Cited

U.S. PATENT DOCUMENTS

| 3,588,616 | 6/1971 | Palazzini | 361/393 |
| 3,964,087 | 6/1976 | Mallon | 338/308 |
| 4,356,532 | 10/1982 | Donaher et al. | 174/52 FP |
| 4,557,540 | 12/1985 | Forbes et al. | 439/69 |
| 4,645,943 | 2/1987 | Smith, Jr. et al. | 361/401 |

FOREIGN PATENT DOCUMENTS 2755550 6/1979 Fed. Rep. of Germany ........ 439/68

Primary Examiner—Neil Abrams
Attorney, Agent, or Firm—James P. McAndrews; John A. Haug; Melvin Sharp

[57] ABSTRACT

A socket having contacts mounted on an electrically insulating body for detachably connecting terminal pins of an integrated circuit unit into a test circuit during testing of the integrated circuit unit has circuit components such as resistors incorporated on a base board accommodated at the bottom of the insulating body, the resistors being connected to the respective contacts and having terminal pins extending therefrom to be connected into the test circuit, thereby to provide an external resistance for each integrated circuit pin during testing in a compact and convenient manner to permit high unit density during testing.

6 Claims, 4 Drawing Sheets

TEST SOCKET INCORPORATING CIRCUIT ELEMENTS

BACKGROUND OF THE INVENTION

The field of this invention is that of sockets for mounting integrated circuit units and the invention relates in particular to sockets for use in testing of such integrated circuit units.

It is customary to use sockets with metal contacts for mounting integrated circuit (IC) units on circuit boards and in the case where such sockets are to be employed for example for a burn-in test (accelerated test) it has been conventional practice to provide an external resistance for each IC terminal pin.

In the conventional arrangement, a plurality of the conventional sockets are arranged on a circuit mounting board. An external resistance is connected with each contact of each socket and each IC socket contact is connected with the test circuit through those external resistance components. Typically the external resistance is not required for the contacts for the source voltage pin and the ground voltage pin of the IC socket. In a burn-in test, a plurality of such mounting boards prepared in this manner are placed within and heated in a test oven.

In that conventional arrangement, the assembly operation was complicated because of the large number of external resistances to be installed on the mounting boards. In addition the area of the mounting boards occupied by the external resistances is large with the result that the mounting density is frequently not very high.

Such a problem is not avoided whether the resistance components constitute fixed resistors, variable resistors, or pattern resistances, etc.

SUMMARY OF THE INVENTION

It is an object of this invention to provide a socket having a small area occupied by resistors or other circuit components such that the socket with its resistors or other circuit components is capable of being compactly accommodated on circuit mounting boards for mounting IC units connected with external test circuits with improved mounting density.

Briefly described, the socket of the invention comprises a contact to be electrically connected to a terminal pin of an external electrical component such as an IC unit, a main socket body that holds the contact element, and means for electrically connecting the contact element with an external circuit (such as a test circuit for burn-in testing), characterized in that the socket incorporates an integrally provided base circuit board with prescribed circuit components such as resistors thereon to be connected between the contact element and said external circuit. In a preferred embodiment, the resistors are provided as pattern resistances or films deposited on a ceramic base board or the like with each resistor having a pair of leads; the base board is accommodated at the bottom of the socket body; the contact elements each connect to one lead of a respective resistor on the ceramic base board; and additional terminal members are connected to the other leads of the respective resistors to extend from the socket to be connected into the external circuit. In that structure, the sockets are compactly accommodated with improved density on the mounting board, and the resistors are conveniently dated on the mounting board.

DESCRIPTION OF THE DRAWINGS

Other objects, details and advantages of the socket of this invention appear in the following detailed description of preferred embodiments of the invention, the detailed description referring to the drawings in which.

DESCRIPTION OF PREFERRED EMBODIMENTS

Figure 9:
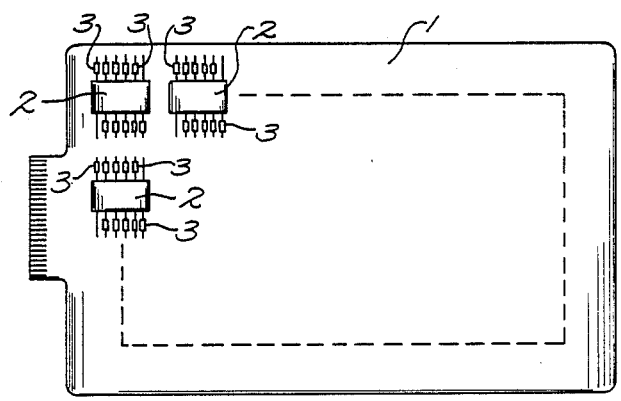
FIG. 9 is a plan view similar to FIG. 4 illustrating a prior art IC socket test system.

In the conventional structure which is shown in FIG. 9, a plurality of IC sockets 2 are arranged on a mounting board 1. An external resistance component 3 is connected with each of the terminal pins of each IC socket 2 and each IC socket 2 is connected with the test circuit (which is not shown in the drawings) through these external resistance components 3. Typically however, the external resistance components 3 are not required for the contacts for the source voltage pin and the ground voltage pin of the IC socket 2 as indicated in FIG. 9. In connection with the burn-in test, a plurality of the actual mounting boards 1 are prepared in this manner and they are placed and heated in a test oven.

According to such a structure based on the conventional technology, however, assembly operation was complicated because a large number of external resistance components 3 have to be installed on the mounting board 1. In addition, the area in the mounting board 1 occupied by the external resistance components 3 is large, with a result that the mounting density is not necessarily high.

Such a problem cannot be avoided even if the resistance component may be constituted by a fixed, variable resistor or pattern resistance, etc.

Figure 1:
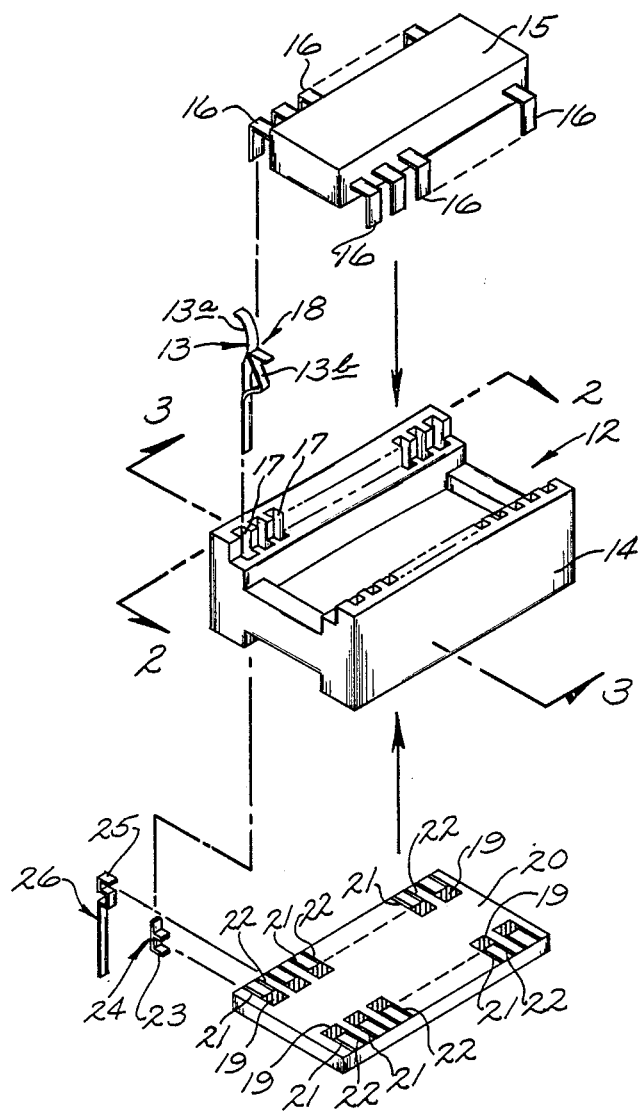
FIG. 1 is an exploded perspective view of the socket of this invention.
Figure 2:
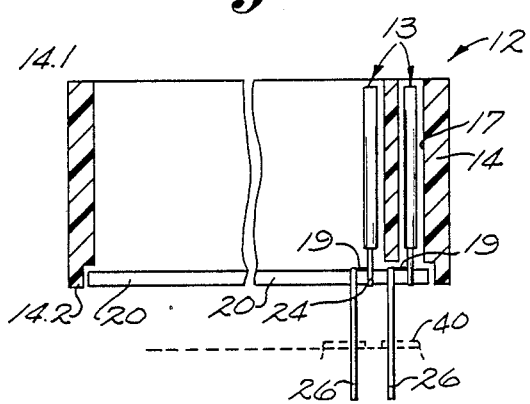
FIG. 2 is a section view to enlarged scale along line 2—2 in FIG. 1.

In the present invention, the IC sockets 12 of this invention as shown in FIGS. 1-4 are equipped with a plurality of electrically conductive contacts 13 and with a body 14 of a electrically insulating material such as glass-filled nylon, a phenolic resin or the like. The body has a plurality of insertion holes or openings 17 as shown in FIG. 2, those openings extending between a top 14.1 and a bottom 14.2 of the body. The plurality of contacts 13 are arranged in such a way as to correspond to each location of the plurality of terminal pins 16 of an integrated circuit (IC) chip unit 15 as illustrated in FIG. 1 which is to be provided on and mounted in the socket 12. Each contact 13 is preferably formed by a linkage of two resilient or elastic metal pieces 13a and 13b in a conventional manner so that the terminal pin 16 of the IC unit is resiliently sandwiched and grasped or held between the metal pieces 13a and 13b in the contact area of the contact member 13 as indicated at 18 in FIG. 3. It is noted that the bottom 14.2 of the socket body has a selected area and although the portion of the body located just beneath the IC chip unit is shown to be blocked with the resin or other material of the body it will be understood there could be a large clearance opening in that portion of the body if desired.

Figure 3:
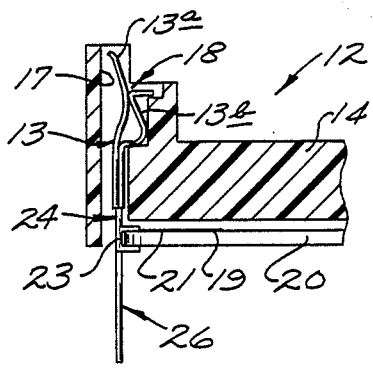
FIG. 3 is a partial section view to enlarged scale along line 3—3 of FIG. 1.

In accordance with his invention, a base board or wafer 20 of an electrical insulating material such as a ceramic has a plurality of resistors 19 or other circuit components positioned thereon. Preferably for example, the resistors are arranged in a pattern or array of film resistors or the like deposited on the base board and the base board is inserted into, fixed or located at the bottom of the socket body 14, the base board preferably having an area corresponding to that of the socket body bottom to be accommodated at the bottom of the body. A pair of leads 21 and 22 are preferably provided on the base board connected to each of the pattern resistances 19 as shown in FIG. 1. For each resistance 19, an electrically conductive member 24, preferably having a connective end portion 23 which is in the form of a U, is fitted over an edge of the base board 20 to engage a respective one of the leads 22 for making electrical connection to the lead 22, an opposite end of the conductive member 24 being electrically connected to a respective contact 13 in any conventional manner. If desired the conductive member 24 is soldered to the contact 13 or is detachably attached by being resiliently grasped between pieces of the contact corresponding to metal pieces 13a and 13b. Similarly, for each resistance 19, a terminal pin 26, also preferably having a connective end portion 25 of U-shape, is fitted over the edge of the base board 20 for making electrical connection to a respective one of the leads 21, the terminal pin 26 extending from the bottom of the socket 12 as shown in FIGS. 2-3 to be electrically connected into an external test circuit as diagrammatically illustrated at 40 in FIG. 2.

In other words, the electroconductive members 24 and terminal members 26 are fixed to the base board 20 by inserting each of the U-shaped connective elements 23 and 25 thereof onto the leads 21 and 22 respectively from the side edge of the base board 20 in such a way as to maintain a close electrical contact. The conductive members 24 when attached to the contacts 13 serve to mount the base board at the bottom of the socket body. As a consequence of this, a pattern resistance 19 is connected between each electroconductive member 24 and a terminal member 26. Since the electroconductive members 24 are fixed to the contacts 13, the aforementioned pattern resistances 19 are, after all, connected between the contacts 13 and the test circuit. The connection of the various members described above may be effected by using solder; however, where the connection means 23 and 25 are fitted over the base board edge to resiliently grip the leads 22, the connection of 23 and 25 with the leads on the base board 20 are effected without solder if desired.

By constructing a socket having a ceramic base board 20 with resistances 19 provided thereon, as thus described, the base board is incorporated integrally in the socket 12 with the body 14 and provides each IC terminal with an IC protective circuit element that will prevent the flow of an overcurrent to the IC chip unit at the time of a burn-in test by the action of the resistance 19. Inasmuch as the same makes it unnecessary to mount an external resistance component, it becomes possible to improve the efficiency of the assembling work and carry out a burn-in test more efficiently by elevating the mounting density.

In the above case, since the resistance 19 is provided on the base board 20 and the base board is incorporated into the socket with the body 14, the size of the socket 12 itself is almost the same as the conventional product (without any change in the external dimensions). That is, the base board is accommodated within the area of the bottom of the socket body.

It is not only possible to drastically reduce the area occupied by the resistance on the printed base board having a test circuit but can improve the mounting density including the socket. In addition, it becomes easier to assembly the socket, thereby making it possible to achieve mass production and lowered cost.

Figure 4:
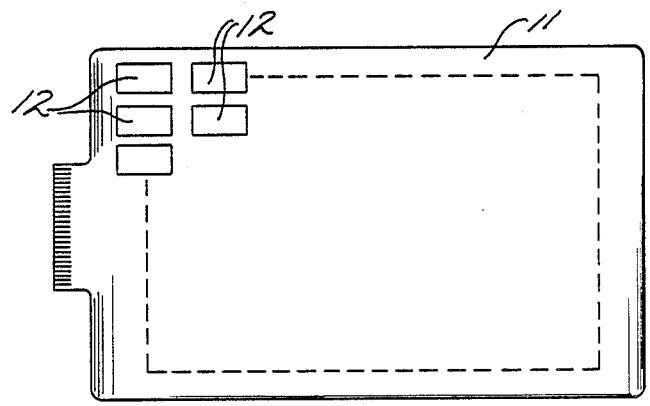
FIG. 4 is a plan view of a mounting board illustrating use of the socket of this invention.

In FIG. 4, a plurality of IC sockets 12 according to this example are arranged in a pre-determined manner on a mounting board 11 consisting of a printed circuit or mounting board. As is shown in the drawings, an external resistance component is not provided on the mounting board 11 and the IC sockets 12 are installed at a high mounting density.

Figure 5:
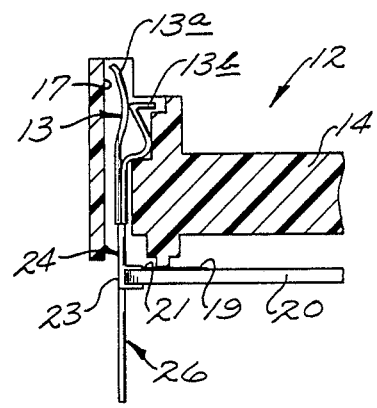
FIG. 5 is a partial section view similar to FIG. 3 illustrating an alternate embodiment of the invention.

FIG. 5 shows the IC sockets 12 according to another example. This is different from FIGS. 1-3 in that a base board 20 with a resistance 19 provided thereon is fixed somewhat protuberantly below the bottom of the body 14.

In the examples shown in FIGS. 1-3, the base board 20 is inserted into the body 14, with the external dimensions of the socket being approximately the same as the conventional product. In FIG. 5, however, the base board 20 is fixed in such a way as to somewhat protrude downward, with a result that the external dimensions become somewhat larger. Nevertheless, there is full advantage of ease of connection of the resistances with the incorporation of the base board 20.

Figure 6:
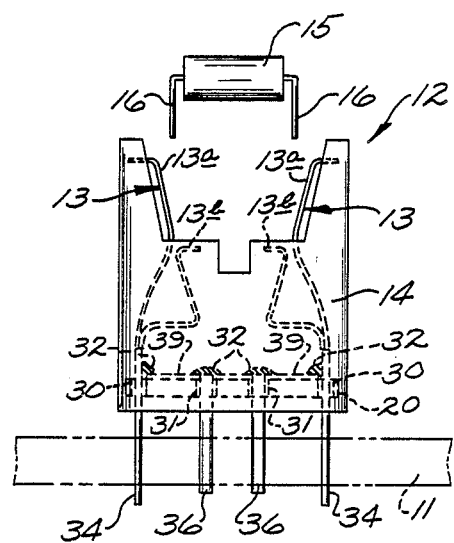
FIG. 6 is a section view similar to FIG. 2 illustrating another alternate embodiment of this invention.
Figure 7:
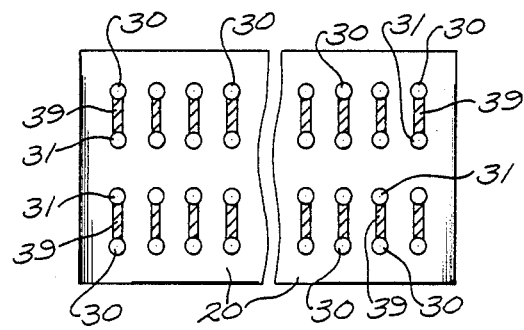
FIG. 7 is a plan view of a component of the socket of this invention as used in the embodiment of the invention illustrated in FIG. 6.

FIGS. 6 and 7 show still another example. According to this example, the shape of the socket is somewhat different from the example described above. That is, the pattern resistance 39 is formed on the ceramic base board 20 as clearly shown in FIG. 7, with through holes 30 and 31 being formed at both ends of each resistance. A conductive member 34 which is fixed to a contact 13 and a terminal member 36 for signal input are inserted into these through-holes and are fixed by soldering as indicated at 32.

By incorporating a base board 20 with the aforementioned resistance 39 being provided thereon as described above, an IC protective circuit can be effectively constituted, with a high mounting density becoming a reality. Since it becomes possible to insert a conductive member 34 as well as the terminal member 36 through the lead insertion hole (which is not shown in the drawing) of the mounting board 11 on both sides of the socket to be fixed, the installation strength at the time of the mounting becomes substantial and its safety is also improved.

Figure 8:
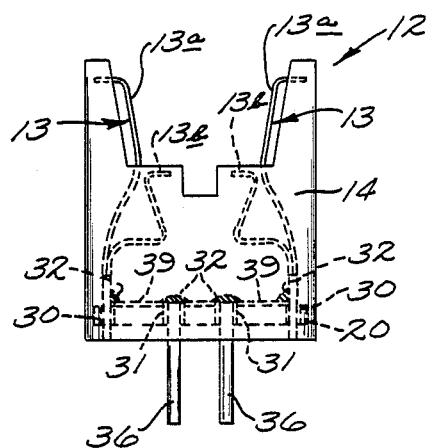
FIG. 8 is a section view similar to FIG. 6 illustrating another alternate embodiment of the invention.

The example shown in FIG. 8 is the same as what is shown in FIG. 6 except for the fact that the contacts 13 extend into openings 30 without the use of separate conductive members and the conductive member 34 is omitted here. This also provides secure mounting by the lead pins 36 being fixed to the mounting board 11.

In each of the examples described above, the contact 13 for the IC socket 12 and the body 14 that holds these contacts 13 may be separately formed beforehand, followed by the mounting of a plurality of contacts 13 in secure relation on the body 14, or the plurality of contacts 13 may be incorporated at the time of the forming of the body 14, by insert molding being adopted. In this case, there is an effect of further improving the productivity.

In the above, examples of this invention have been described. It should be pointed out that the aforementioned examples can further be modified on the basis of the technical concept of this invention.

For example, not only the construction and shape of the socket that has been described above but also the shape of the contact and its installed construction, and the fixed structure of the base board with a pattern resistance provided thereon, etc. can be modified. The pattern of the pattern resistance and the manner of its formation may also be modified variously.

In addition, the component that is provided on the base board may be a circuit component other than the pattern resistance such, for instance, as a condenser or it may assume the form of a mixed IC base board. Further, individual resistances 19 may be omitted and replaced with a shunt for ground or power connections if desired.

In the example described above, moreover, this invention was used for the IC socket to be used for the burn-in test. However, the application of this invention is not limited to the IC sockets for the burn-in test but includes all the IC sockets generally in a wide range.

Since this invention provides for a construction integrally having a base board with a circuit component to be connected between the contact and external circuit provided thereon, it becomes possible to reduce or eliminate the area occupied by the circuit element, thereby making it possible to improve miniaturization and mounting density. Moreover, the construction of the socket itself including the circuit element becomes compact and assembling also becomes easier since the incorporation of the base board alone is freshly added.

It should be understood that this invention includes modifications and equivalents of the disclosed embodiments falling within the scope of the appended claims.

I claim:

1. A socket comprising an electrically insulating body having a top, having a bottom of selected area, and having a plurality of openings extending through the body between said top and bottom; an insulating base board having a selected area corresponding to the area of the bottom of the body accommodated at the bottom of the body; a plurality of circuit components mounted in spaced relation to each other on the base board; first circuit means on the base board secured to respective first portions of the components on the base board for making electrical connections to the respective components; other circuit means on the base board secured to respective other portions of the components on the base board for electrically connecting the components in a circuit; a plurality of electrically conductive contacts disposed in the respective body openings for detachably electrically engaging respective terminal pins of an integrated circuit unit inserted therein from the top of the body to mount the integrated circuit unit on the socket, said contacts having portions connected to respective first circuit means on the base board for electrically connecting the terminal pins of the integrated circuit to the respective components and for mounting and supporting the insulating base board on the body at the bottom of the body; and a plurality of terminal members secured to said respective other circuit means on the base board to be electrically connected to the respective circuit components and to support the terminal members to extend from the base board to be connected in an external circuit for connecting the integrated circuit terminal pins in the external electrical circuit with the circuit components in series between the respective integrated circuit unit terminal pins and said external circuit.

2. A socket according to claim 1 wherein the first and other circuit means for each component on the base board comprise a first lead and other lead respectively extending from the component toward an edge of the base board, the contacts comprise conductive members which have end portions fitted over an edge of the base board to electrically engage respective first leads from each respective circuit component and to mount and support the base board at the bottom of the body, and the terminal members are electrically conductive, have portions at one end fitted over an edge of the base board to electrically engage the respective other leads of each circuit component to mount and support the terminal members on the base board to extend from the base board to be electrically connected to said external circuit.

3. A socket according to claim 2 wherein the electrically insulating body is recessed for accommodating the base board and circuit components therein.

4. A socket according to claim 3 wherein the base board comprises a ceramic element and the circuit components comprise electrical resistance films arranged in arrays adjacent edges of the element, each resistance film having a pair of leads extending therefrom toward an edge of the ceramic element, one lead to be engaged by said conductive member and the other lead by said terminal member respectively.

5. A socket according to claim 4 wherein the conductive members and terminal members each have U-shaped end portions fitted over an edge of the element for electrically engaging the respective leads.

6. A socket according to claim 5 wherein said U-shaped portions resiliently grip the element edges.

* * * * *